United States Patent
Ul Haq (10) Patent No.: US 9,331,637 B2
(45) Date of Patent: May 3, 2016

(54) HYBRID DC-DC CONVERTERS FOR POWER AMPLIFIERS

(71) Applicant: Nokia Corporation, Espoo (FI)

(72) Inventor: Faizan Ul Haq, Tampere (FI)

(73) Assignee: Nokia Technologies Oy, Espoo (FI)

( * ) Notice: Subject to any disclaimer, the term of this patent is extended or adjusted under 35 U.S.C. 154(b) by 37 days.

(21) Appl. No.: 14/047,437

(22) Filed: Oct. 7, 2013

(65) Prior Publication Data
US 2015/0097625 A1    Apr. 9, 2015

(51) Int. Cl.
*H03F 3/193* (2006.01)
*H03F 1/02* (2006.01)
*H03F 3/24* (2006.01)
*H03F 3/217* (2006.01)

(52) U.S. Cl.
CPC ............ *H03F 1/0238* (2013.01); *H03F 1/0227* (2013.01); *H03F 3/193* (2013.01); *H03F 3/2173* (2013.01); *H03F 3/245* (2013.01); H03F 2200/102 (2013.01); H03F 2200/451 (2013.01)

(58) Field of Classification Search
USPC ................................... 330/297, 136, 127, 279
See application file for complete search history.

(56) References Cited

U.S. PATENT DOCUMENTS

| | | | | |
|---|---|---|---|---|
| 7,990,214 | B2 * | 8/2011 | Markowski | 330/136 |
| 8,050,638 | B2 * | 11/2011 | Vinayak et al. | 455/126 |
| 8,362,649 | B2 * | 1/2013 | Fisher et al. | 307/86 |

OTHER PUBLICATIONS

Hassan et al., "A Combined Series Parallel Hybrid Envelope Amplifier for Envelope Tracking Mobile Terminal RF Power Amplifier Applications", IEEE Journal of Solid-State Circuits, vol. 47, Issue: 5, May 2012, pp. 1185-1198.
Abedinpour et al., "A Multi-Stage Interleaved Synchronous Buck Converter with Integrated Output Filter in a 0.18/spl mu/SiGe Process", IEEE International Solid-State Circuits Conference, Digest of Technical Papers, Feb. 6-9, 2006, pp. 1398-1407.

* cited by examiner

*Primary Examiner* — Hieu Nguyen
(74) *Attorney, Agent, or Firm* — Mintz Levin Cohn Ferris Glovsky and Popeo, P.C.

(57) ABSTRACT

Methods and apparatus, including computer program products, are provided for hybrid DC-DC converters. In one aspect, there is provided a method. The method may include tracking, by an envelope detector, an envelope of a signal being amplified by an amplifier. The method may further include supplying, by a first direct-current to direct-current converter, power to the amplifier, the power supplied by the first direct-current to direct-current converter including one or more high-frequency components of the envelope tracked by the envelope detector. The method may further include supplying, by a second direct-current to direct-current converter, power to the amplifier, the power supplied by the second direct-current to direct-current converter including one or more low-frequency components of the envelope tracked by the envelope detector. Related systems, apparatuses, and computer program products are also disclosed.

23 Claims, 6 Drawing Sheets

HYBRID DC-DC CONVERTERS FOR POWER AMPLIFIERS

The subject matter described herein relates to direct-current to direct-current (DC-DC) converters.

BACKGROUND

Direct-current to direct-current (DC-DC) converters are used in a wide variety of consumer and industrial products including desktop computers, printers, laptops, and cell phones. In some products, the efficiency a DC-DC converter is not of particular importance. However, in other types of products efficiency is important, particularly when the product is battery-powered. In battery-powered products, efficiency translates to longer operating time and fewer recharges of the battery.

SUMMARY

Methods and apparatuses, including computer program code are disclosed herein that provide a hybrid DC-DC converter.

In one aspect, there is provided a method. The method may include tracking, by an envelope detector, an envelope of a signal being amplified by an amplifier. The method may further include supplying, by a first direct-current to direct-current converter, power to the amplifier, the power supplied by the first direct-current to direct-current converter including one or more high-frequency components of the envelope tracked by the envelope detector. The method may further include supplying, by a second direct-current to direct-current converter, power to the amplifier, the power supplied by the second direct-current to direct-current converter including one or more low-frequency components of the envelope tracked by the envelope detector.

In some variations, one or more of the features disclosed herein including the following features can optionally be included in any feasible combination. A power amplifier may be coupled to the envelope detector, the first direct-current to direct-current converter, and the second direct-current to direct-current converter. The first direct-current to direct-current converter may be characterized by a frequency response defined at least in part by a fast ramp voltage. The second direct-current to direct-current converter may be characterized by a frequency response defined at least in part by a slow ramp voltage. The transistor widths of the first direct-current to direct-current converter may be between about 500 microns and about 1000 microns in a 65 nanometer semiconductor process. The transistor widths of the second direct-current to direct-current converter may be between about 5 millimeters and about 10 millimeters in a 65 nanometer semiconductor process.

The above-noted aspects and features may be implemented in systems, apparatuses, methods, and/or computer-readable media depending on the desired configuration. The details of one or more variations of the subject matter described herein are set forth in the accompanying drawings and the description below. Features and advantages of the subject matter described herein will be apparent from the description and drawings, and from the claims. In some exemplary embodiments, one or more variations may be made as well as described in the detailed description below and/or as described in the following features.

DESCRIPTION OF DRAWINGS

In the drawings.

Like labels are used to refer to same or similar items in the drawings.

DETAILED DESCRIPTION

The high peak-to-average power ratio (PAPR) required by some devices compliant with communication standards, such as the Long Term Evolution series of standards and the like, may cause excessive power dissipation in the transmitter power amplifier. By tracking the envelope of a signal being amplified by the power amplifier, the power supply voltage and/or current (or "supply power") to the power amplifier may be adjusted according to the envelope. Supply power is the voltage and/or current supplied to the power amplifier in order for the power amplifier to operate. Traditionally, the supply power is direct current voltage and current with a constant value. In the embodiments disclosed herein, the supply power (voltage and/or current) vary over time according to the envelope of the signal being amplified by the power amplifier. Adjusting the supply power according to the envelope may reduce the power dissipated in the power amplifier. Moreover, adjusting the supply power of the power amplifier according to the envelope may increase the power efficiency of the power amplifier. In some example embodiments, the power efficiency may be determined as a ratio of the radio frequency power available at the output of the power amplifier divided by the average DC power supplied to the power amplifier, although other determinations of efficiency may be used as well.

To adjust the supply power to the power amplifier according to a rapidly varying envelope of a signal being amplified by the power amplifier may require that the DC-DC converter supplying power to the power amplifier have a wide bandwidth. In some example embodiments, the bandwidth of a switching DC-DC converter depends on the switching frequency of the converter. Higher bandwidths require higher switching frequencies. However, increasing the switching frequency above a certain practical value may result in unacceptable switching losses in the output transistors. As the power required by the power amplifier increases, output transistors that are physically wider may be needed. While the conductive losses in transistors may decrease with wider transistor widths, switching losses may increase. As a result, transistor widths beyond a predetermined value become impractical due to prohibitively high switching losses.

Increased losses due to either increased transistor width or increased switching frequency may result in decreased power efficiency.

In some example embodiments, a hybrid DC-DC converter may include two switching DC-DC converters operated at different switching frequencies. The two switching DC-DC converters may operate in parallel with class-D output stages.

The first switching DC-DC converter in some example embodiments may provide the lower frequency components of the supply power provided to a power amplifier according to the envelope signal. The first switching DC-DC converter may include transistors with wide transistor widths operated at slow switching frequencies. For example, a slow switching frequency may be about 100 MHz, although other slow switching frequencies may be used as well. Slow switching frequencies tend to reduce switching losses for any given transistor width. The use of wider width transistors can provide higher output current with reduced conductive losses. A wide transistor width and a slow switching frequency may increase the efficiency of the first switching DC-DC converter for a given load current.

The second switching DC-DC converter may in some example embodiments provide the higher frequency components of the supply power provided to the power amplifier according to the envelope signal. In some embodiments, the current required by the power amplifier at the high frequency components of the envelope may be less than at the low frequency components of the envelope. In these embodiments, the second switching DC-DC converter may include transistors with widths narrower than the transistors of the first switching DC-DC converter. These narrower transistors may be operated at a high switching frequency to provide the high frequency components of the hybrid DC-DC converter current according to the envelope of a signal being amplified by the power amplifier. For example, a high switching frequency may be about 300 MHz, although other frequencies may be used as well. Although the higher switching frequency may increase the switching losses of the second switching DC-DC converter, the overall transistor losses may be low because of the smaller transistor widths.

Figure 1A:
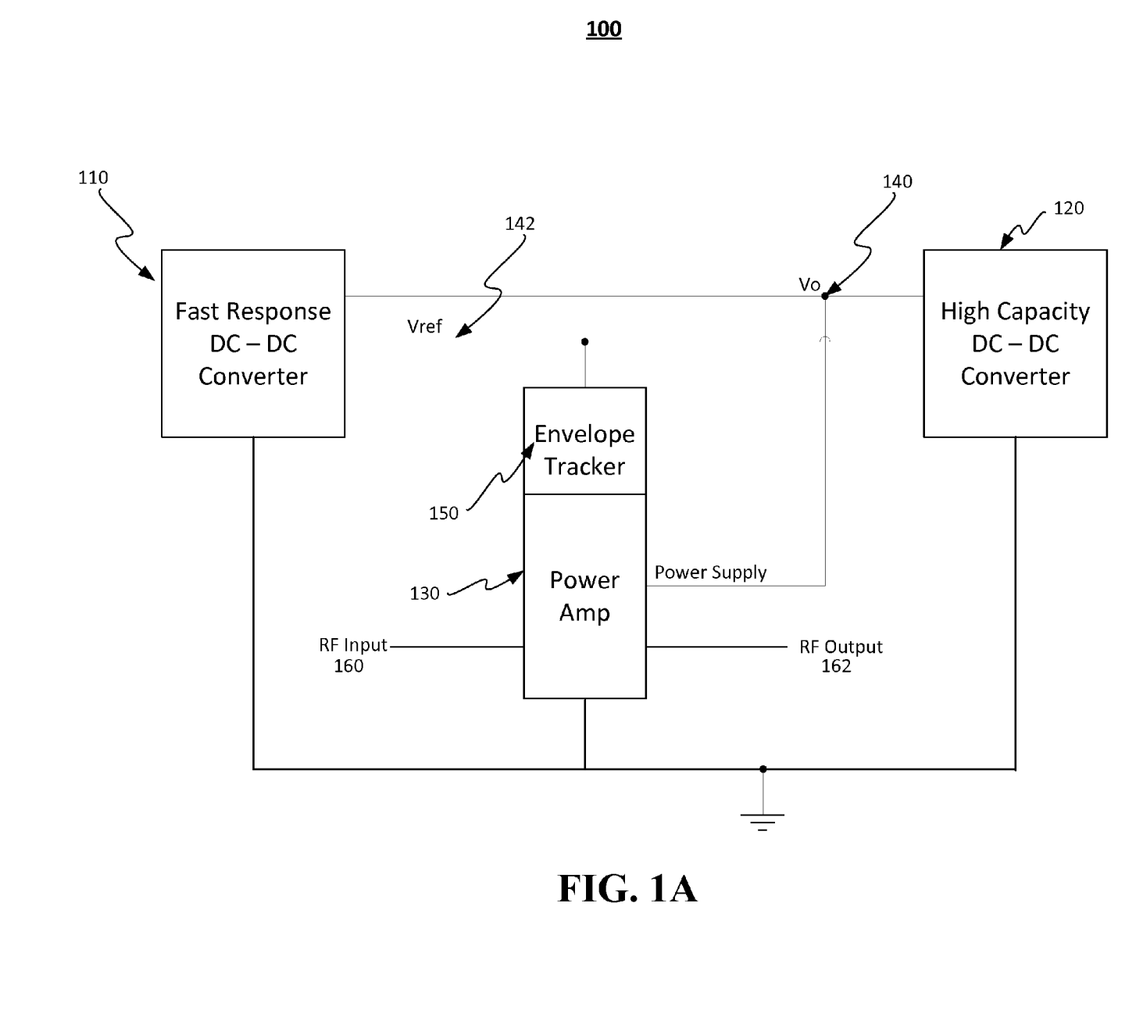
FIG. 1A depicts a system including a hybrid switching DC-DC converter, in accordance with some example embodiments.

FIG. 1A depicts a system 100 including a hybrid switching DC-DC converter, in accordance with some example embodiments. The system 100 may include a power amplifier 130, an envelope tracker 150, a first switching DC-DC converter 110 (labeled fast response DC-DC converter), and a second switching DC-DC converter 120 (labeled high capacity DC-DC converter). First switching DC-DC converter 110 may also be referred to as a low output current, high bandwidth DC-DC converter, and second switching DC-DC converter 120 may also be referred to as a high output current, small bandwidth DC-DC converter.

The power amplifier 130 may receive an input signal, such as radio frequency (RF) input 160, and amplify signal 160 to form an amplified output signal, such as RF output signal 162.

The envelope tracker 150 may track the envelope of RF signal 160 being amplified by power amplifier 130 and/or the envelope tracker 150 may track the envelope of RF output signal 162. The envelope tracker 150 may output the envelope as an output at Vref 142, so Vref 142 represents the tracked waveform of the signal being amplified. This output, Vref 142, may be provided to fast response DC-DC converter 110 and high-capacity DC-DC converter 120.

Fast response DC-DC converter 110 may, in some example embodiments, supply power at $V_O$ 140 to power amplifier 130 at frequencies corresponding to the high-frequency components of the envelope (Vref 142) tracked by envelope tracker 150. Vref 142 is a representation of the tracked waveform/envelope provided by envelope tracker 150. The fast response of fast response DC-DC converter 110 is due at least in part to the fast ramp voltage (e.g., Vramp_fast 220A in FIG. 2 described further below) that is produced in, or provided to, fast response DC-DC converter 110.

High-capacity DC-DC converter 120 may, in some example embodiments, supply power at $V_O$ 140 to power amplifier 130 at frequencies corresponding to the low-frequency components of the tracked waveform/envelope represented by Vref 142. The slow response of high capacity converter 120 is due at least in part to the slow ramp voltage (e.g., Vramp_slow 220B in FIG. 2 described further below) that is produced in or provided to high-capacity DC-DC converter 120.

Power amplifier 130 may be implemented in a variety of ways, but in some example embodiments power amplifier 130 may be configured to support waveforms with non-constant envelops. These technologies include LTE cellular technologies or any other cellular technology, WLAN technology such as WiFi (e.g., the IEEE 802.11 series of standards), WiMAX (e.g., the IEEE 802.16 family of standards), Bluetooth, radio frequency identification (RFID) technologies, ultrawideband (UWB) technologies, ZigBee, and the like.

Figure 1B:
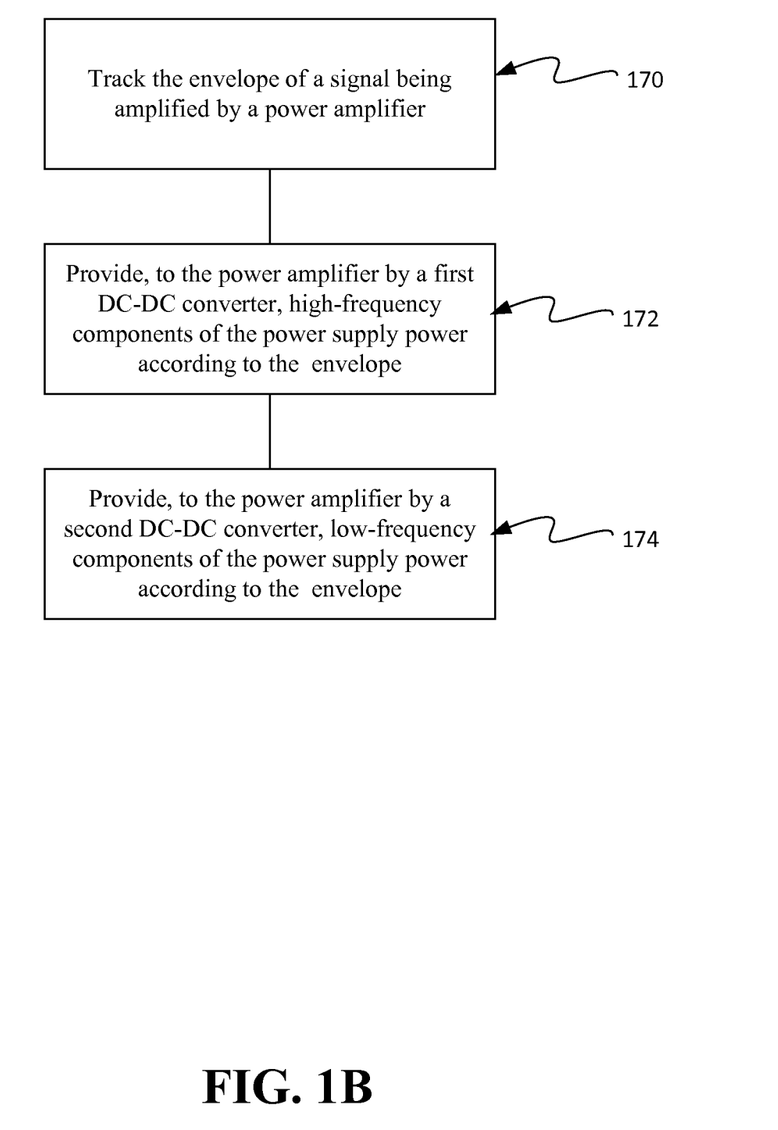
FIG. 1B depicts a process for a hybrid DC-DC converter to supply power to a power amplifier, in accordance with some example embodiments.

FIG. 1B depicts a process for a hybrid DC-DC converter supplying power to a power amplifier, in accordance with some example embodiments. The description of FIG. 1B also refers to FIG. 1A.

At 170, an envelope tracker may provide a representation of the envelope of a signal amplified by power amplifier 130. For example, envelope tracker 150 may track the envelop (for example, the waveform shape) of RF signal 160 and/or RF output signal 162, and then provide an output, such as Vref 142 representative of the tracked waveform/envelope, to fast response DC-DC converter 110 and high capacity DC-DC converter 120.

At 172, a fast response DC-DC converter may provide supply power to a power amplifier at frequencies corresponding to the high-frequency components of the envelope provided at 170. For example, a fast response DC-DC converter 110 may supply power at $V_O$ 140 at frequencies corresponding to the high-frequency components of the envelope Vref 142 tracked by envelope tracker 150.

At 174, a high-capacity DC-DC converter may provide supply power to power amplifier at frequencies corresponding to the low-frequency components of the envelope provided at 170. For example, high-capacity DC-DC 120 converter may supply power at $V_O$ 140 to power amplifier 130 at frequencies corresponding to the low-frequency components of the envelope Vref 142 tracked by envelope tracker 150. The combination of the envelope tracking, the high-capacity DC-DC converter, and the fast response DC-DC converter provides the supply power needed by the power amplifier to follow the envelope of the amplified signal. By providing the supply power that is needed and not more power or less power, the power amplifier operates with higher power efficiency compared to alternative DC-DC converters.

Figure 2:
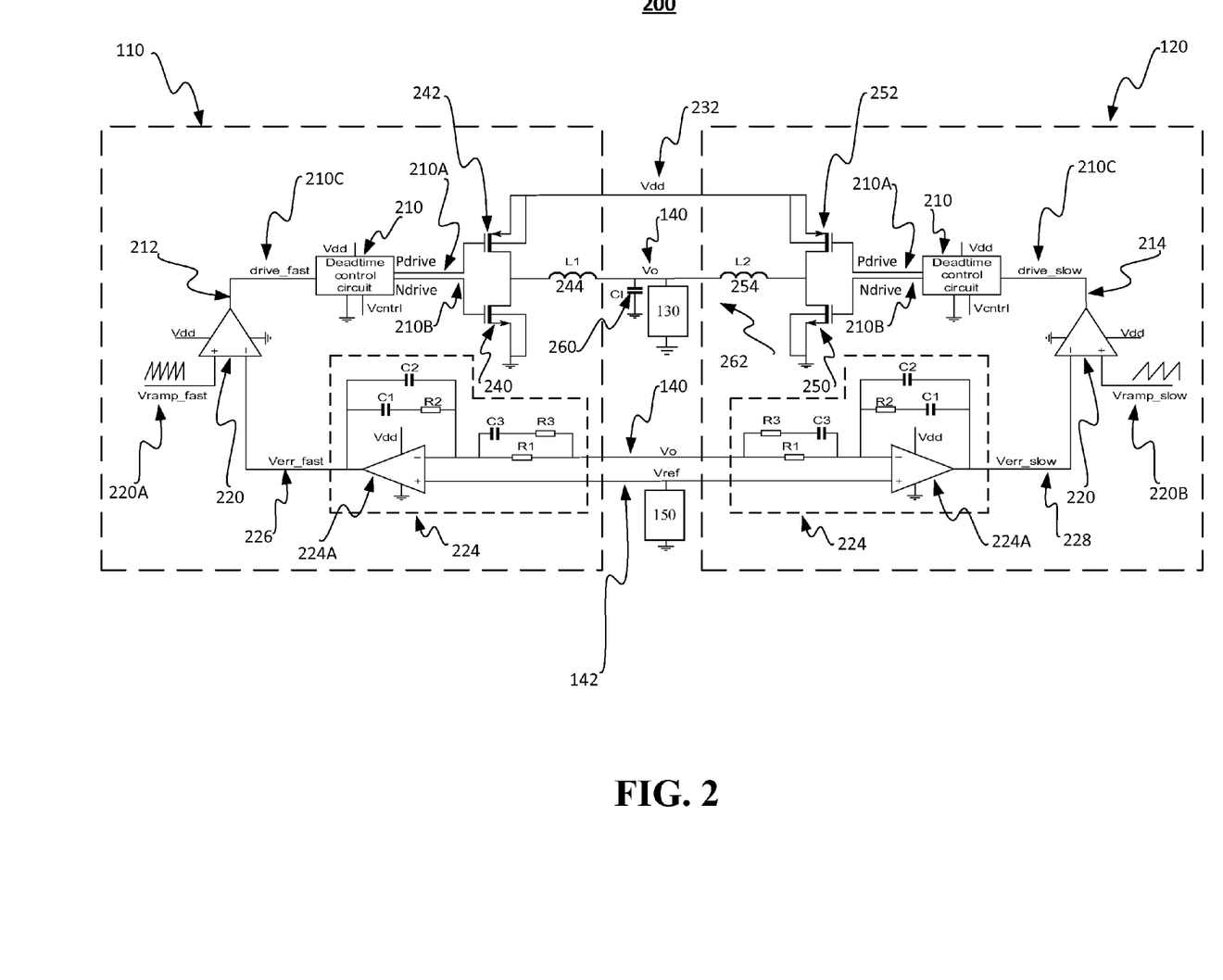
FIG. 2 depicts a schematic diagram of a hybrid switching DC-DC converter, in accordance with some example embodiments.

FIG. 2 depicts another example of a system 200 of a hybrid switching DC-DC converter, in accordance with some example embodiments. The description of FIG. 2 may also refer to FIG. 1A.

An envelope tracker, such as envelope tracker 150, may provide an envelope Vref 142 of a signal amplified by power amplifier 130. The envelope may be provided to fast response DC-DC converter 110 and high-capacity DC-DC converter 120. Fast response DC-DC converter 110 may supply power to power amplifier 130 at frequencies corresponding to the high-frequency components of the envelope, and high-capacity DC-DC converter 120 may supply power to power amplifier 130 at frequencies corresponding to the low-frequency components of the envelope In some example embodiments, fast response DC-DC converter 110 and high-capacity DC-DC converter 120 may utilize a pulse-width modulation feedback loop in which an error amplifier 224A compares the voltage $V_O$ 140 with an envelope voltage Vref 142 and generates the error voltage 226, 228. The error voltage may be compared with a fast ramp signal 220A or a slow ramp signal 220B to form a pulse width modulated waveform 212 or 214, respectively. The comparison may be performed by voltage comparator 220. A deadtime control circuit 210 may be implemented before the final output stage (e.g., FIG. 2 at 240, 242, 250, and 252) to provide a zero-voltage switching condition. For example, in example embodiments consistent with FIG. 2, the envelope may be represented by a voltage between about 625 millivolts and about 825 millivolts, or the envelope may be represented by, for example, a time varying 16-bit value, although other voltages and bit sizes may be realized as well.

In some example embodiments, fast response DC-DC converter 110 may supply power at 140 to power amplifier 130 at frequencies corresponding to the high-frequency components of the envelope tracked by envelope tracker 150. The fast response of DC-DC converter 110 is due at least in part to a fast ramp voltage (Vramp_fast) 220A produced in or provided to fast response DC-DC converter 110. In some example embodiments, the ramp at Vramp_fast 220A repeats at about 300 MHz, that is, the time between successive ramp peaks is 3.33 nanoseconds. Sub-circuit 224 may produce a voltage Verr_fast 226 that is representative of a filtered difference between the voltage $V_O$ at 140 and the envelope Vref 142. Vref 142 is a representation of the envelope from an envelope tracker, such as envelope tracker 150. Vramp_fast 220A may be compared to Verr_fast 226 by comparator 220 producing drive_fast 212, which is provided to deadtime control circuit 210 at 210C. The output of the deadtime control circuit 210A may be used to drive a p-type output transistor 242, and the output of the deadtime control circuit 210B may drive an n-type transistor 240. To prevent both the n-type and p-type transistors from being on at the same time, thus shorting Vdd 232 to ground, a predefined delay (or deadtime) is added by deadtime control circuit 210 to Pdrive 210A and Ndrive 210B. The output voltage $V_O$ 140 may be formed by the combination of n-type and p-type transistors output filtered by inductor L1 244 and capacitor C1 260. In some example embodiments, L1 244 may be about 30 nanohenries and C1 260 is about 4 nanofarads, although other values may be used as well. In some example embodiments, the n-type transistor 240 may be an NMOS transistor made in a 65 nanometer semiconductor process and has a transistor width of about 500 microns, and the p-type transistor 242 may be a PMOS transistor made in the same process and has a transistor width of about 1000 microns, although other types of transistors, widths, and processes may be used as well.

High-capacity DC-DC converter 120 may, in some example embodiments, supply power at 140 to power amplifier 130 at frequencies corresponding to the low-frequency components of the envelope tracked by envelope tracker 150. The high-capacity DC-DC converter 120 may provide the low frequency components at least in part due to slow ramp voltage Vramp_slow 220B produced in or provided to high-capacity DC-DC converter 120. In some example embodiments, the ramp at Vramp_slow 220B may repeat at about 100 MHz, that is, the time between successive ramp peaks is 10 nanoseconds. Sub-circuit 224 may produce a voltage Verr_slow 228 that is representative of a filtered difference between the voltage $V_O$ at 140 and the envelope Vref 142. Vramp_slow 220B may be compared to Verr_slow 228 at comparator 220 producing an output of drive_slow 214. The drive_slow 214 may be provided to deadtime control circuit 210 at 210C. The output of the deadtime control circuit 210A may be used to drive the p-type output transistor 252, and the output of the deadtime control circuit 210B may be used to drive the n-type transistor 250. The output voltage $V_O$ 140 may be formed as a combination of n-type and p-type transistors output filtered by inductor L2 254 and capacitor C1 260. In some example embodiments, L2 254 is about 30 nanohenries and C1 260 is about 4 nanofarads, although other values may be used as well. In some example embodiments, the n-type transistor 250 is an NMOS transistor produced in a 65 nanometer semiconductor process and has a transistor width of about 5 millimeters, and the p-type transistor 252 is a PMOS transistor produced in the same process and has a width of about 10 millimeters, although other transistor types, widths, and processes may be used as well.

The combination of the power produced by high-capacity DC-DC converter 120 and fast response DC-DC converter 110 is supplied to power amplifier 130 at $V_O$ 140 to allow the combination of the power amplifier 130 and DC-DC converters 110, 120 to operate with more power efficiency than a linear converter or other DC-DC converter.

Figure 3:
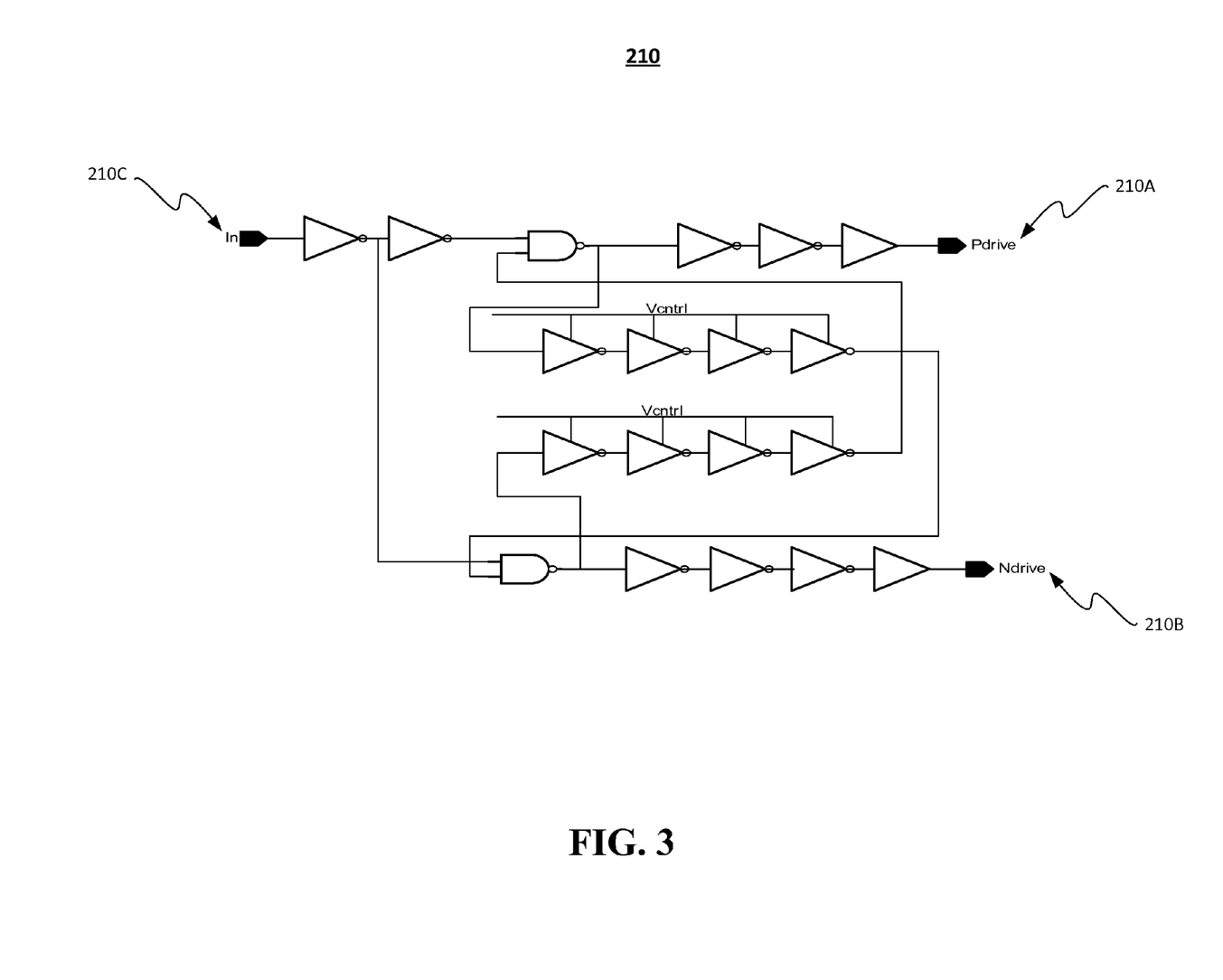
FIG. 3 depicts a schematic diagram of a deadtime control circuit, in accordance with some example embodiments.

FIG. 3 depicts an example of a deadtime control circuit 210. The deadtime control circuit 210 may accept a pulse width modulated signal such as drive_fast 212 or drive_slow 214 and may produce signals Pdrive 210A (which drives the p-type transistors such as transistors 242, 252) and Ndrive 210B (which drives the n-type transistors such as transistors 240, 250).

The class-D switching DC-DC converters such as 110 and 120 in FIG. 2 may include n-type and p-type output transistors such as 240, 242, 250, and 252. The transistors may be switched on and off alternatively by the Pdrive 210A and Ndrive 201B signals. The transistors take some time to completely turn-on or turn-off. To prevent both the n-type and p-type transistors from being on at the same time, thus shorting Vdd 232 to ground, a predefined delay (or deadtime) is added by deadtime control circuit 210 to Pdrive 210A and Ndrive 210B. In some embodiments, the transistors may be switched when the drain to source voltage of the transistors is zero (sometimes referred to as zero voltage switching or ZVS).

Figure 4:
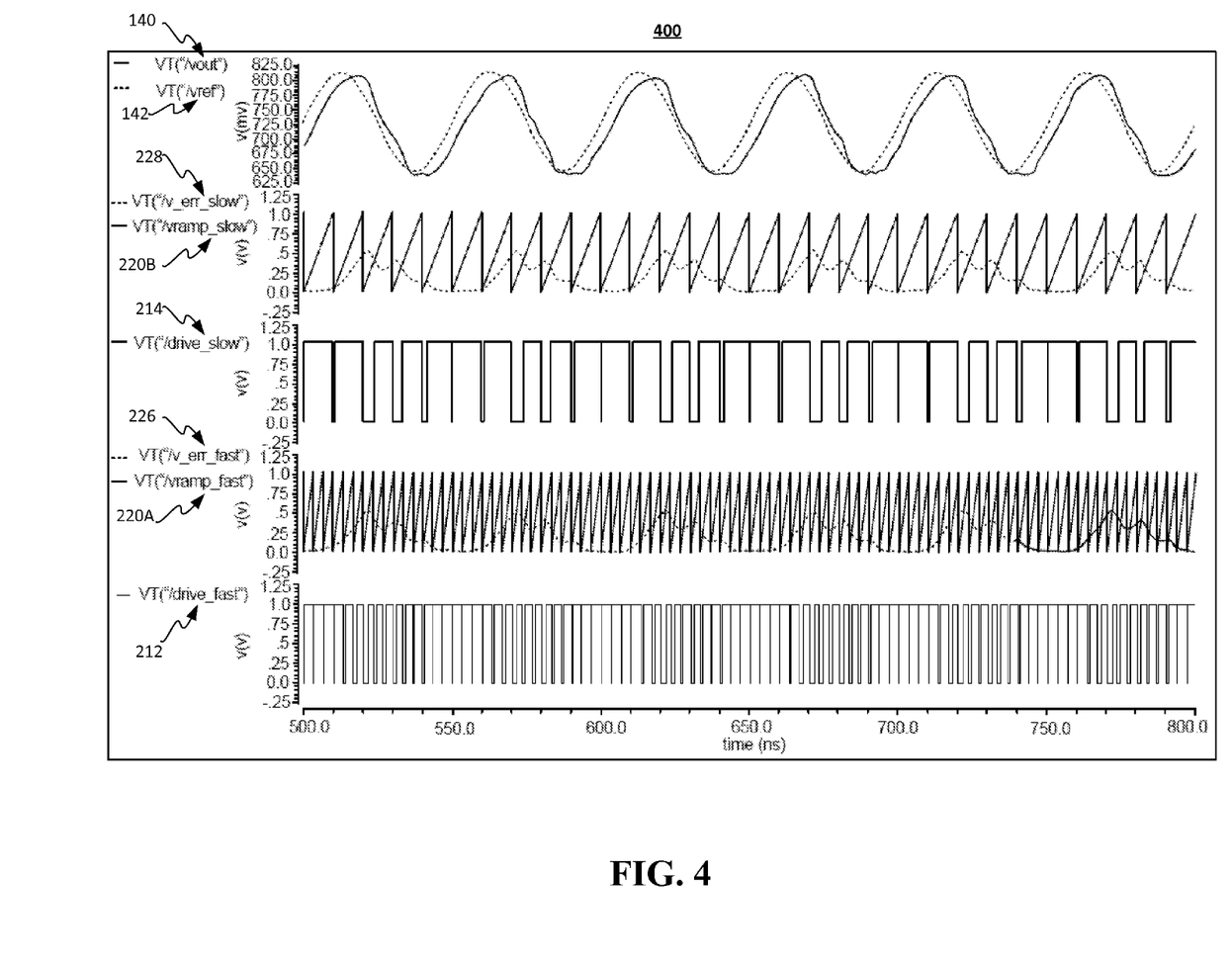
FIG. 4 depicts examples of waveforms produced by a hybrid switching DC-DC converter, in accordance with some example embodiments.

FIG. 4 depicts examples of waveforms produced by a hybrid switching DC-DC converter, in accordance with some example embodiments. FIG. 4 at 140 depicts the voltage waveform at 140 in FIG. 2, when the envelope Vref 142 is a 20 MHz sinusoidal voltage, power amplifier 130 is equivalent to a about a 1.3Ω resistor, and Vdd 232 is about 1 volt. FIG. 4 at 228 depicts the voltage waveform Verr_slow 228 in FIG. 2. FIG. 4 at 220B depicts the voltage waveform Vramp_slow 220B in FIG. 2. FIG. 4 at 214 depicts the voltage waveform drive_slow 214 in FIG. 2. FIG. 4 at 226 depicts the voltage waveform Verr_fast 226 in FIG. 2. FIG. 4 at 220A depicts the voltage waveform Vramp_fast 220A in FIG. 2. FIG. 4 at 212 depicts the voltage waveform drive_slow 212 in FIG. 2.

Although specific voltage values and waveforms are shown in FIG. 4, other voltage values and waveforms may also be used.

Figure 5:
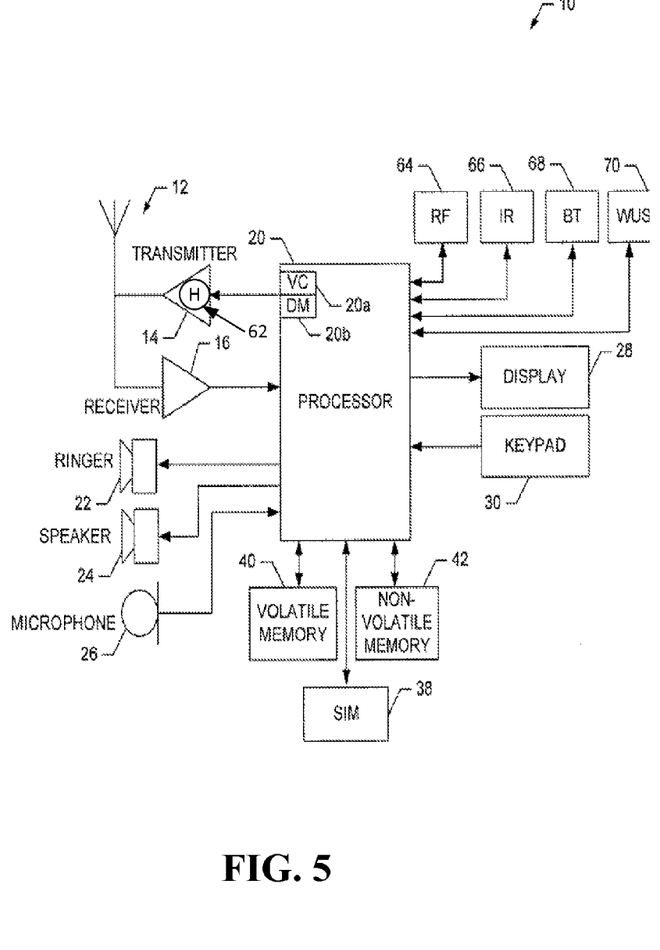
FIG. 5 depicts a block diagram of an apparatus that can be configured as user equipment, in accordance with some example embodiments.

FIG. 5 illustrates a block diagram of an apparatus 10, which can be configured as user equipment, in accordance with some example embodiments. The apparatus 10 may include a hybrid DC-DC converter 62 including fast response DC-DC converter 110, high capacity DC-DC converter 120, and envelope tracker 150.

The apparatus 10 may include at least one antenna 12 in communication with a transmitter 14 and a receiver 16. Alternatively transmit and receive antennas may be separate.

The apparatus 10 may also include a processor 20 configured to provide signals to and from the transmitter and receiver, respectively, and to control the functioning of the apparatus. Processor 20 may be configured to control the functioning of the transmitter and receiver by effecting control signaling via electrical leads to the transmitter and receiver. Likewise processor 20 may be configured to control other elements of apparatus 10 by effecting control signaling via electrical leads connecting processor 20 to the other elements, such as for example a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Apparatus 10 may include a location processor and/or an interface to obtain location information, such as positioning and/or navigation information. Accordingly, although illustrated in FIG. 5 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as for example, Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as for example, Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as for example, Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as for example LTE Advanced and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as for example, a web browser. The connectivity program may allow the apparatus 10 to transmit and receive web content, such as for example location-based content, according to a protocol, such as for example, wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as for example, the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 10 to receive data, such as for example, a keypad 30 (which can be a virtual keyboard presented on display 28 or an externally coupled keyboard) and/or other input devices.

Moreover, the apparatus 10 may include a short-range radio frequency (RF) transceiver and/or interrogator 64, so data may be shared with and/or obtained from electronic devices in accordance with RF techniques. The apparatus 10 may include other short-range transceivers, such as for example an infrared (IR) transceiver 66, a Bluetooth (BT) transceiver 68 operating using Bluetooth wireless technology, a wireless universal serial bus (USB) transceiver 70, and/or the like. The Bluetooth transceiver 68 may be capable of operating according to low power or ultra-low power Bluetooth technology, for example, Wibree, radio standards. In this regard, the apparatus 10 and, in particular, the short-range transceiver may be capable of transmitting data to and/or receiving data from electronic devices within a proximity of the apparatus, such as for example within 10 meters. The apparatus 10 including the WiFi or wireless local area networking modem may also be capable of transmitting and/or receiving data from electronic devices according to various wireless networking techniques, including 6LoWpan, Wi-Fi, Wi-Fi low power, WLAN techniques such as for example IEEE 802.11 techniques, IEEE 802.15 techniques, IEEE 802.16 techniques, and/or the like.

The apparatus 10 may comprise memory, such as for example, a subscriber identity module (SIM) 38, a removable user identity module (R-UIM), and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment/mobile terminal. The memories may comprise an identifier, such as for example an international mobile equipment identification (IMEI) code, capable of uniquely identifying apparatus 10. The functions may include one or more of the operations disclosed herein with respect to the DC-DC converters disclosed herein including the process flow of FIG. 1B. The memories may comprise an identifier, such as for example, an international mobile equipment identification (IMEI) code, capable of uniquely identifying apparatus 10. In the example embodiment, the processor 20 may be configured using computer code stored at memory 40 and/or 42 to provide the operations disclosed with respect to the DC-DC converters disclosed herein including the process flow of FIG. 1B.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as for example a computer or data processor circuitry, with examples depicted at FIG. 5. A computer-readable medium may comprise a non-transitory computer-readable storage medium that may be any media that can contain or store the instructions for use by or in connection with an instruction execution system, apparatus, or device, such as for example a computer. Furthermore, some of the embodiments disclosed herein include computer programs configured to cause methods as disclosed herein (see, for example, the process of FIG. 1B and/or the like).

The subject matter described herein may be embodied in systems, apparatus, methods, and/or articles depending on the desired configuration. For example, the systems, apparatus, methods, and/or articles described herein can be implemented using one or more of the following: electronic components such as transistors, inductors, capacitors, resistors, and the like, a processor executing program code, an application-specific integrated circuit (ASIC), a digital signal processor (DSP), an embedded processor, a field programmable gate array (FPGA), and/or combinations thereof. These various example embodiments may include implementations in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "machine-readable medium" refers to any computer program product, computer-readable medium, computer-readable storage medium, apparatus and/or device (e.g., magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Although some of the examples described herein refer to the use of specific technologies, such as LTE, WiFi, and the like, the subject matter described herein is not limited to those technologies, and, as such, can be used with other radio technologies as well.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

What is claimed:
1. An apparatus comprising:
an envelope detector to track an envelope of a signal being amplified by an amplifier;
a first direct-current to direct-current switching converter supplying, via a first dead time control circuit, power to the amplifier, the power supplied by the first direct-current to direct-current switching converter including one or more high-frequency components of the envelope tracked by the envelope detector, wherein the first direct-current to direct-current switching converter is a switching power supply; and
a second direct-current to direct-current switching converter supplying power, via a second dead time control circuit, to the amplifier, the power supplied by the second direct-current to direct-current switching converter including one or more low-frequency components of the envelope tracked by the envelope detector, wherein the second direct-current to direct-current switching converter is another switching power supply.

2. The apparatus of claim 1, further comprising:
a power amplifier coupled to the envelope detector, wherein the envelope detector couples to input of the first direct-current to direct-current switching converter, and wherein the envelope detector couples to another input of the second direct-current to direct-current switching converter.

3. The apparatus of claim 1, wherein the first direct-current to direct-current switching converter is characterized by a high frequency response defined at least in part by a fast ramp voltage provided as an input to the first dead time control circuit.

4. The apparatus of claim 2, wherein the first transistor width is between about 500 microns and about 1000 microns in a 65 nanometer semiconductor process.

5. The apparatus of claim 1, wherein the second direct-current to direct-current switching converter is characterized by a low frequency response defined at least in part by a slow ramp voltage provided as an input to the second dead time control circuit.

6. The apparatus of claim 2, wherein the second transistor width is between about 5 millimeters and about 10 millimeters in a 65 nanometer semiconductor process.

7. The apparatus of claim 1, wherein a wireless user equipment includes the apparatus.

8. The apparatus of claim 1, wherein the first direct-current to direct-current switching converter operates at a switching frequency of two hundred megahertz, or higher, to enable high power efficiency, when the first direct-current to direct-current switching converter includes one or more transistors with widths between about 500 microns and about 1000 microns.

9. The apparatus of claim 1, wherein the second direct-current to direct-current switching converter operates at a switching frequency of below two hundred megahertz to enable high power efficiency, when the second direct-current to direct-current switching converter includes one or more transistors with widths between about 5 millimeters and about 10 millimeters.

10. The apparatus of claim 1, wherein the first direct-current to direct-current switching converter is characterized by a high frequency response defined at least in part by a first transistor width, wherein the second direct-current to direct-current switching converter is characterized by a low frequency response defined at least in part by a second transistor width, wherein the first transistor width is smaller than the second transistor width.

11. A non-transitory computer-readable medium encoded with instructions that, when executed by at least one processor, cause at least the following:
tracking, by an envelope detector, an envelope of a signal being amplified by an amplifier;
supplying, by a first direct-current to direct-current switching converter, power to the amplifier, the power supplied, via a first dead time control circuit, by the first direct-current to direct-current switching converter including one or more high-frequency components of the envelope tracked by the envelope detector, wherein the first direct-current to direct-current switching converter is a switching power supply; and
supplying, by a second direct-current to direct-current switching converter, power to the amplifier, the power supplied, via a second dead time control circuit, by the second direct-current to direct-current switching converter including one or more low-frequency components of the envelope tracked by the envelope detector, wherein the second direct-current to direct-current switching converter is another switching power supply.

12. The non-transitory computer-readable medium of claim 11 further comprising:
coupling a power amplifier to the envelope detector, wherein the envelope detector couples to an input of the first direct-current to direct-current switching converter, and wherein the envelope detector couples to another input of the second direct-current to direct-current switching converter.

13. The non-transitory computer-readable medium of claim 11,
wherein the first direct-current to direct-current switching converter is characterized by a high frequency response defined at least in part by a fast ramp voltage provided as an input to the first dead time control circuit.

14. The non-transitory computer-readable medium of claim 12,
wherein the first transistor width is between about 500 microns and about 1000 microns in a 65 nanometer semiconductor process.

15. The non-transitory computer-readable medium of claim 11, wherein the second direct-current to direct-current switching converter is characterized by a low frequency response defined at least in part by a slow ramp voltage provided as an input to the second dead time control circuit.

16. The non-transitory computer-readable medium of claim 12, wherein the second transistor width is between about 5 millimeters and about 10 millimeters in a 65 nanometer semiconductor process.

17. The non-transitory computer-readable medium of claim 11, wherein a wireless user equipment includes the envelope detector, the first direct-current to direct-current switching converter, and the second direct-current to direct-current switching converter.

18. An method comprising:
tracking, by an envelope detector, an envelope of a signal being amplified by an amplifier;
supplying, by a first direct-current to direct-current switching converter, power to the amplifier, the power supplied, via a first dead time control circuit, by the first direct-current to direct-current switching converter including one or more high-frequency components of the envelope tracked by the envelope detector, wherein the first direct-current to direct-current switching converter is a switching power supply; and
supplying, by a second direct-current to direct-current switching converter, power to the amplifier, the power supplied, via a second dead time control circuit, by the second direct-current to direct-current switching converter including one or more low-frequency components of the envelope tracked by the envelope detector, wherein the second direct-current to direct-current switching converter is another switching power supply.

19. The method of claim 18, further comprising:
coupling a power amplifier to the envelope detector, wherein the envelope detector couples to an input of the first direct-current to direct-current switching converter, and wherein the envelope detector couples to another input of the second direct-current to direct-current switching converter.

20. The method of claim 18, wherein the first direct-current to direct-current switching converter is characterized by a high frequency response defined at least in part by a fast ramp voltage provided as an input to the first dead time control circuit.

21. The method of claim 19, wherein the first transistor width is between about 500 microns and about 1000 microns in a 65 nanometer semiconductor process.

22. The method of claim 18, wherein the second direct-current to direct-current switching converter is characterized by a low frequency response defined at least in part a slow ramp voltage provided as an input to the second dead time control circuit.

23. The method of claim 19, wherein the second transistor width is between about 5 millimeters and about 10 millimeters in a 65 nanometer semiconductor process.

* * * * *